United States Patent [19]

Siegel et al.

[11] Patent Number: 5,450,443
[45] Date of Patent: Sep. 12, 1995

[54] METHOD AND APPARATUS FOR CONSTRUCTING ASYMPTOTICALLY OPTIMAL SECOND ORDER DC-FREE CHANNEL CODES

[75] Inventors: Paul H. Siegel; Alexander Vardy, both of San Jose, Calif.

[73] Assignee: International Business Machines Corporation, Armonk, N.Y.

[21] Appl. No.: 116,147

[22] Filed: Sep. 1, 1993

[51] Int. Cl.$^6$ ............... H04L 25/34; H04L 25/49
[52] U.S. Cl. ............................ 375/286; 360/40; 341/58
[58] Field of Search ............... 375/19, 292; 360/39, 360/40; 341/56, 58

[56] References Cited

U.S. PATENT DOCUMENTS

| | | |
|---|---|---|
| 4,309,694 | 1/1982 | Henry . |
| 4,499,454 | 2/1985 | Shimada ................... 341/58 |
| 4,731,797 | 3/1988 | Jaffre et al. ............... 375/19 |
| 4,750,138 | 6/1988 | Schouhamer Immink ....... 375/19 |
| 4,831,635 | 5/1989 | Lee et al. . |
| 4,901,331 | 2/1990 | Calderbank et al. . |
| 5,022,051 | 6/1991 | Crandall et al. .......... 375/19 |
| 5,276,708 | 1/1994 | Hertmann ................ 375/19 |

OTHER PUBLICATIONS

K. A. Schouhamer Immink, Properties and Construction of Binary Channel Codes, Chapter 3, reprinted from Philips Journal of Research. Chapter 3, Spectrum Shaping with Binary DC2-Constrained Channel Codes, pp. 49–62.

K. A. Schouhamer Immink & F. M. Beenker, Binary Transmission Codes with Higher Order Spectral Zeros at Zero Frequency, IEEE Transactions of Info. Theory, vol. IT-33, No. 3, pp. 452–454, May 1987.

R. Karabed & P. H. Siegel, Matched Spectral-Null Codes for Partial-Response Channels, IEEE Transactions on Info. Theory, vol. 37, pp. 818–855, May 1991.

R. F. Lyon, Two-Level Block Encoding for Digital Transmission, IEEE Transactions on Communication, pp. 1438–1441, Dec. 1973.

J. P. M. Schalwijk, An Algorithm for Source Coding, IEEE Transactions on Information Theory, vol. IT-18, No. 3, pp. 395–399, May 1972.

C. M. Monti & G. L. Pierobon, Codes with a Multiple Spectral Null at Zero Frequency, IEEE Transactions on Information Theory, vol. 35, No. 2, pp. 463–472, Mar. 1989.

E. Eleftheriou & R. D. Cideciyan, On Codes Satisfying Mth-Order Running Digital Sum Constraints, IEEE Transactions on Information Theory, vol. 37, No. 5, pp. 1294–1313, Sep. 1991.

*Primary Examiner*—Stephen Chin
*Assistant Examiner*—William Luther
*Attorney, Agent, or Firm*—Philip E. Blair; James C. Pintner

[57] ABSTRACT

An encoding apparatus for constructing an asymptotically optimal coding scheme for second order DC-constrained channels is disclosed. A first encoding function block breaks an input data stream into equal sized vectors of length m bits. A sign designation bit is then attached to each vector to make vectors of length m+1 bits. r redundancy bits are added to each vector, to produce balanced vectors of length m+1+r bits. A first moment is calculated for each vector. A determination is made whether the addition of this vector's first moment value to an accumulated running sum of all the vectors' first moments effectively drives the running sum in the direction of zero. If is does then that vector's first moment is added to the accumulated running sum of first moments and the vector is added to the output array. If not, then the value of that vector's first moment is inverted before being added to the accumulated running sum, and the individual bits of this vector get inverted, and the sign designation bit of that vector gets toggled so as to indicate upon decoding that the bits of this vector have been involved. This encoding process is repeated until all the first moments of all the individual vectors of the balanced array have been calculated and a total accumulated running sum of all the first moments has been determined. A last balanced vector is produced, whose first moment value is added to the value of the total accumulation running first moment sum to drive the final first moment sum to zero. The output array of such vectors is then second-order DC-free, and the above described encoder is asymptotically optimal for second order DC-constrained channels.

51 Claims, 5 Drawing Sheets

METHOD AND APPARATUS FOR CONSTRUCTING ASYMPTOTICALLY OPTIMAL SECOND ORDER DC-FREE CHANNEL CODES

FIELD OF THE INVENTION

Broadly conceived, the present invention relates to methods and apparatus for constructing DC-free channel codes and, in particular, to the construction of second order DC-free channel codes of length n and rate R such that the limit of R for n approaching infinity equals 1.

BACKGROUND HISTORY

A relatively large number of digital transmission and recording systems require the use of codes, often called constrained codes, that impose restrictions on the channel's input data sequences. These codes are primarily designed to improve timing and gain control in a receiving unit and shape the spectrum of the transmitted sequences such that it matches the frequency characteristics of the channel. In addition, these codes reduce intersymbol interference.

In digital transmission and storage it is often required for the channel stream to have low power near zero frequency. In other words, the code must reject the low frequency components. If the code has no spectral energy at Direct Current (or DC), it is said to be DC-free or DC-balanced.

In the early sixties, DC-free codes were used to suppress the spectral components of encoded sequences near zero frequency and were instrumental in reducing the effects of Direct Current wander (or DC wander) during data transmission through metallic components of both the transmitting and receiving systems.

In the power spectrum of a DC-balanced code, the frequency region with suppressed components is often characterized by a quantity referred to as the cutoff frequency which is proportional to the redundancy of the coded sequence. Moreover, the power spectral density function of these codes is often characterized by a parabolic shape in the low frequency range from DC to the cutoff frequency. In addition to their spectral shaping properties, codes with a spectral null (DC-balanced) possess distance properties, i.e., they increase the Euclidean distance at the output of partial response channels that are often encountered in digital transmission over wires as well as in digital magnetic or optical recording, and can thus be used to improve the overall reliability of data transmission over relatively noisy channels.

Many other DC-free channel codes have been designed and implemented in a broad range of products with the aim of suppressing the power of the encoded data transmission stream at the lower frequencies. For example, magnetic recording channels have a spectral null at DC and thus substantially high frequency attenuation characteristics. The design of most of these codes is based upon a running digital sum constraint wherein the running digital sum is defined for a truncated binary sequence as the accumulated sum of positive and negative 1's from the beginning of the transmitted code sequence up to the defined point of truncation. However, in some applications such as magneto-optic recording or PRML magnetic recording it is desirable to achieve a higher rejection of the low frequency components than is possible with standard DC-free codes. In order to achieve such rejection a second order DC-free code may be used. That is, a code is implemented having the second derivative of the code spectrum vanishing at zero frequency which results in a substantial decrease of the power at low frequencies for a fixed code redundancy as compared with the more conventional first-order DC-free coding schemes.

In the paper by K. A. Schouhamer Immink and G. F. M. Beenker, "Binary Transmission Codes with Higher Order Spectral Zeros at Zero Frequency", IEEE Trans. Inform. Theory, Vol. IT-33, pp. 452-454, (May 1987), a technique was presented for designing binary channel codes in such a way that both the power spectral density function and its low order derivatives vanish at zero frequency. The performance of the new codes was compared with that of channel codes designed with a constraint on the unbalance of the number of transmitted positive and negative pulses. The power spectral density function of these codes, besides having zero power at zero frequency, has all low order derivatives up to order $2K+1$ equal to zero at zero frequency. The minimum distance of such K-th order zero disparity codes is shown to be at least $2(K+1)$. Furthermore, the added contraints result in a higher rejection of the components in the low frequency range than is generally possible with the first-order DC-free codes. The results of which indicate that the capacity of the second order DC-free channel approaches its limiting value of 1 slowly as is shown in the following Table, wherein the number M of $DC^2$-constrained codewords and the rate R of the corresponding code are compared with the codeword length n.

| n  | M         | R     |
|----|-----------|-------|
| 4  | 2         | 0.250 |
| 8  | 8         | 0.375 |
| 12 | 58        | 0.488 |
| 16 | 526       | 0.565 |
| 20 | 5448      | 0.621 |
| 24 | 61108     | 0.662 |
| 28 | 723354    | 0.695 |
| 32 | 8908546   | 0.722 |
| 36 | 113093022 | 0.743 |

As a result, second order DC-free codes with rates of more practical interest are generally only possible if the codeword length is relatively large.

In another paper by E. Eleftheriou and R. D. Cideciyan, "On Codes Satisfying Mth-Order Running Digital Sum Constraints", IEEE Trans. Inform. Theory, Vol. 37, No. 5, pp. 1294-1313, (September 1991), multi-level sequences with spectral null of order L at frequency f, where the power spectral density and its first $2L+1$ derivatives vanish at frequency f, were characterized by finite state transition diagrams whose edge labels satisfy bounds on the variation of the L-th order running digital sum. Distance properties of this class of codes on partial response channels with a spectral null of order P were examined and a lower bound on the minimum Euclidean distance at the output of the partial response channels was obtained. However, this state diagram based approach for code construction may lead to a relatively low rate in those cases where it is desired to keep the complexity low, e.g., the rate $\geq 0.80$ requires $>140$ states in the state diagram.

Thus, existing second order DC-free coding schemes often require relatively sophisticated and complex hardware and/or software for encoding and decoding these sequences which becomes overall prohibitively too complex as the length of the codeword increases. For instance, in a direct encoding scheme which employs one or more relatively large lookup tables for storing the codewords such as that disclosed by Immink, "Coding Techniques for Digital Recorders", New York: Prentice Hall, (1991), the size of the required lookup table(s) grows exponentially with the increased codeword length. For a codeword length of about 28 or more, this kind of the more direct approach becomes impractical since the hardware/software required to implement this technique becomes prohibitively complex.

An alternative enumerative coding scheme, which is also based on lookup table techniques, is disclosed in K. A. Schouhamer Immink, "Spectrum Shaping with Binary $DC^2$-Constrained Channel Codes", Doctoral Thesis pp. 49-62, reprinted Philips Journal of Research, Vol. 40, pp. 40-53, (1985), wherein a class of DC-free codes is taught having the second derivative of the code spectrum vanishing at zero frequency, i.e., a subclass of second order DC-free codes. It is shown therein that if the redundancy is fixed then the cutoff frequency of $DC^2$-balanced codes is approximately a factor of 2.5 smaller than that of classical DC-balanced codes. However, a substantial decrease of the power at low frequencies for a fixed code redundancy is observed. Although the paper presents an enumeration technique for finding the number of codewords to be used in a $DC^2$-balanced code, relatively long codewords have to be used in order for the new codes to have any generally practical rate thereby also making this technique of encoding and decoding prohibitively complex as well. For a codeword of length n, this scheme requires that one precompute and store in a table the number of vectors of length t with first order disparity $d_x$ and second order disparity $d_y$ for all $t=1,2,\ldots,n$ and for all possible values of $d_x$ and $d_y$. Although this technique is better than direct encoding, codeword lengths of for instance $n>100$ and thus high information rates also remain unattainable because of the complexity.

SUMMARY AND OBJECTS OF THE INVENTION

The present invention is directed to methods and apparatus for constructing second order DC-free channel codes of length n and rate R such that the limit of R for n approaching infinity equals 1.

It is a primary object of the present invention to provide an encoding apparatus for constructing asymptotically optimal second order DC-free channel codes which are easily emenable to hardware implementation without requiring relatively large lookup tables and which achieve information rates arbitrarily close to 1.

It is another object of the present invention to provide an encoding apparatus which produce a noiseless channel decoder such that if channel errors occur the length of the channel error propagation is bounded to a small fraction of the codeword length n since the present construction operates on essentially independent information blocks of length $m \leq n$.

It is yet another object of the present invention to provide a specific second order DC-free coding scheme which is readily extendable to codes having second order spectral null at frequency $\frac{1}{2}$, rather than the zero frequency, and which is theoretically extendable to higher order DC-free codes.

It is yet another object of the present invention to simultaneously achieve the constraints which follow from the above primary objectives with minimum overhead.

Briefly and to achieve the objects of the present invention, an encoding apparatus for constructing an asymptotically optimal coding scheme for second order DC-constrained channels is disclosed. The construction involves the encoding of an input data sequence over preselected bipolar binary alphabet, preferably $\{+,-\}$. A first encoding function block breaks the input data stream into equal sized vectors of length m bits. A sign designation bit is then attached to each vector to make vectors of length $m+1$ bits. These vectors are then directed to a balancing function which produces and array of balanced vectors of length $m+1+r$ where r is the number of redundancy bits appended to effectuate the balancing. The individual vectors comprising the balanced array of vectors are then individually directed into a summation block which calculates the first moment of a vector. A determination is made whether the addition of this vector's first moment value to an accumulated running sum of all the vectors' first moments effectively drives the running sum in the direction of zero. If is does then that vector's first moment is added to the accumulated running sum of first moments and the vector is added to the output array. If on the other hand the addition of a vector's calculated first moment to the accumulated running sum of first moments effectively drives the total running sum value in a direction away from zero then the value of that vector's first moment is inverted before being added to the accumulated running sum so as to effectively drive the accumulated running sum in the direction of zero. At the same time, the individual bits of this vector get inverted, i.e. switched to the other symbol of the selected bipolar alphabet, and the sign designation bit of that vector gets toggled so as to indicate upon decoding that the bits of this vector have been inverted. The encoder then clocks-in the next balanced vector from the balancing block function and repeats this encoding process until all the first moments of all the individual vectors of the balanced array have been calculated and a total accumulated running sum of all the first moments has been determined with the intention of always attempting to drive the total accumulated running sum value of all the vectors in the direction of zero so that, upon completion of the encoding of the entire balanced array, the total accumulated running sum is as close to zero as possible. The value of the total running sum is passed to a final function block wherein a last balanced vector is produced using the present technique which is created specifically to have a first moment value, which when added to the value of the total accumulated running first moment sum, achieves the result of driving the final first moment sum to zero. This vector is then appended to the output data array. The output array is then second-order DC-free, and the above described encoder is asymptotically optimal for second-order DC-constrained channels.

Also disclosed is a decoder for implementation with the encoder of the present invention. The decoder of the present invention is the reverse of the above described encoding, but much simpler. The received sequence to be decoded is first partitioned into blocks of length $m+1+r$ bits long in order to reassemble the original encoded array. The information vectors encoded therein are then retrieved by the removal of the final vector which was appended to the output array at the end of the encoding step. The sign designation bit is then checked to determine whether the bits of a particular vector have been inverted or not. If the sign bit indicates that the bits of a vector have been inverted then the bits of that vector are inverted again to produce the vector's original bit sequence prior to inversion during encoding. If the sign bit indicates that the bits have not been inverted then no inverting is done to the vector. The sign bits are checked for all vectors. Once those vectors requiring bit inversion have been inverted, the balancing of the array is undone. The sign designation bit of each vector is subsequently stripped off and the r redundancy bits removed if they haven't already been removed by the decoding of the balancing. The original information vectors of length m bits are thus retrieved.

Included herein are the mathematical relationships which are provided as a support for the assertions that the output data array of the present encoder achieves its stated objectives.

Additional objects and advantages of the present invention will be set forth in the description which follows, and in part will be obvious from the description or may be learned by the practice of this invention. The objects and advantages of this invention as described herein may be realized and obtained by means particularly pointed out and distinctly claimed in the appended claims taken in conjunction with the drawings and detailed specification.

BRIEF DESCRIPTION OF THE DRAWINGS

In order to elucidate the manner in which the above-recited and other advantages and objects of the present invention are obtained, a more particular description of this invention, briefly described above, will be rendered by reference to a specific embodiment thereof which is illustrated in the appended drawings. Understanding that these drawings depict only a typical embodiment of the present invention and are not therefore to be considered in any way limiting of its scope, this invention will be described and explained with additional specificity and detail through the use of the accompanying drawings, in which.

DETAILED DESCRIPTION OF THE PREFERRED EMBODIMENT

Figure 1:
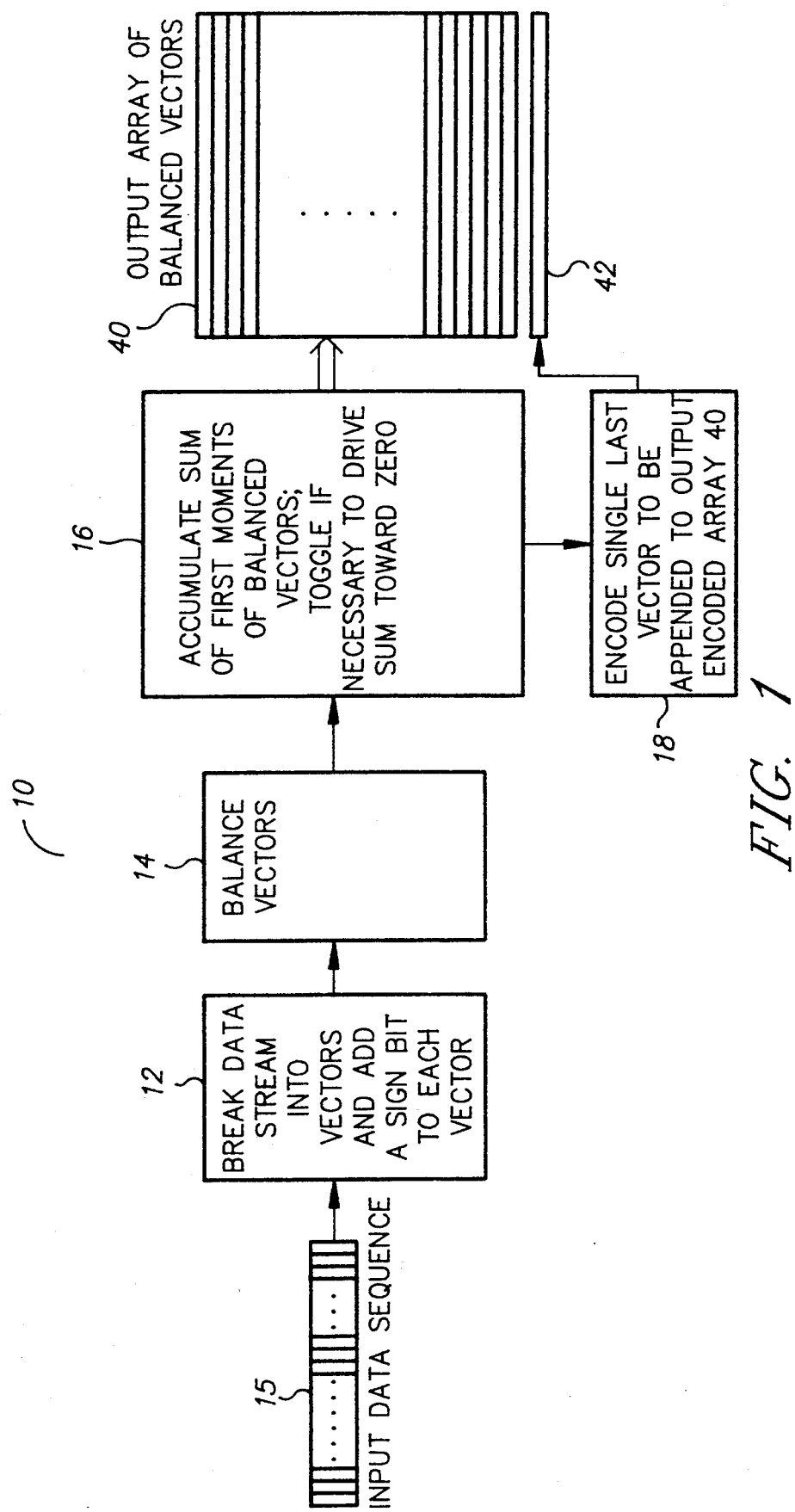
FIG. 1 is a 4-part block diagram of the basic component structure of the encoder of the present invention.

The present invention is an encoding apparatus for constructing second order DC-free channel codes of length n and information rate R which enable one to achieve information rates arbitrarily close to 1 without requiring large lookup tables.

It should be understood that the concepts upon which the techniques disclosed herein find a basis are by nature complex and one who is to be considered skilled in this art should be at a skill level whereat the underlying mathematical relationships inherent herein are readily understood. As such and in order to discuss the particulars of the coding techniques of the present invention, it is appropriate at this juncture to discuss some basic concepts and relationships which are considered fundamental to an understanding of the present invention and, more importantly, to the accompanying propositions and subsequent proofs thereof which show that the present invention indeed achieves its stated objectives, namely that an implementation of the techniques disclosed herein constructs second order DC-free codes which achieve information rates arbitrarily close to 1, and is readily extendable to codes having a second order spectral null at frequency $\frac{1}{2}$ rather than the zero frequency, and which is extendable to the construction of DC-free codes of orders higher than second order.

To begin, let vector $\bar{x}=(x_1, x_2, \ldots, x_n)$ be a binary vector of length n over the bipolar binary alphabet $\{+1, -1\}$. The discrete Fourier transform of this vector $\bar{x}$ is therefore given by:

$$X(\omega) = \sum_{l=1}^{n} x_l e^{jl\omega}.$$

Now, assume that the vector $\bar{x}$ such that for some $-\pi < \omega_0 \leq \pi$:

$$\frac{d^k X(\omega)}{d\omega^k} \bigg|_{\omega=\omega_0} = 0, \text{ for } k = 0, 1 \qquad \text{Eq. 1}$$

and let C be a binary code of length n consisting of vectors satisfying Eq. 1 above. If codewords of the binary code C are randomly chosen and concatenated to form an infinite sequence then, it should be understood that, the power spectral density function $\Phi(\omega)$ of the concatenated sequence satisfies the following relationship:

$$\frac{d^k \Phi(\omega)}{d\omega^k} \bigg|_{\omega=\omega_0} = 0, \, k = 0, 1, 2, 3 \qquad \text{Eq. 2}$$

From the above relationship given by Eq. 2, the binary code C composed of the codewords satisfying Eq. 1 at $\omega_0=0$, is considered second order DC-free. As such, the individual vector $\bar{x}$ satisfying Eq. 1 at $\omega_0=0$ is considered second order DC-constrained (or $DC^2$-constrained) or second order balanced. Also, if Eq. 1 is satisfied for $k=0$, but not necessarily for $k=1$, then the individual vector $\bar{x}$ is considered balanced.

Several equivalent conditions for a vector $\bar{x}$ to be K-th order balanced are taught by Karabed and Siegel, "Matched Spectral-Null Codes for Partial Response Channels", IEEE Trans. Information Theory, Vol. 37, pp. 818–855, (1991) and by Eleftheriou and Cideciyan, "On Codes Satisfying Mth-order Running Digital Sum Constraints", IEEE Trans. Inform. Theory, Vol. 37, No. 5, pp. 1294–1313, (1991). From among these several equivalent conditions as put forth therein, the following condition is herein employed, namely that for an integer $K \geq 0$ vector $\vec{x}$ is K-th order balanced if and only if $m_k(\vec{x})=0$, for $k=0,1,\ldots,K-1$, where $$m_k(\vec{x}) = \sum_{i=1}^{n} i^k x_i$$

denotes the k-th moment of $\vec{x}$. It should be noted that the notation $S^0_n$ and $S^1_n$ is used herein to denote the set of all balanced and second order balanced binary vectors $\vec{x}$ of length n, respectively.

Lastly, let $\vec{y}=(y_1, y_2, \ldots, y_{n1})$ and $\vec{x}=(x_1, x_2, \ldots, x_{n2})$ be two binary vectors with lengths $n_1 \geq n_2$. As such, the vector $\vec{x}$ is said to be contained in the vector $\vec{y}$ starting at position j if $\vec{x}=(\vec{y}_j, \vec{y}_{j+1}, \ldots, \vec{y}_{j+n2-1})$.

As an overview, the present invention is an apparatus which performs the encoding of an input data sequence over a bipolar binary alphabet such that a second order DC-free code is produced at the output. The present encoder is preferably divided into 4 function blocks which perform separate and distinct operations. A first function block breaks the input data stream into equal sized vectors and a sign designation bit is attached to each vector before being directed to a balancing function block wherein the vectors are balanced. The balanced vectors are then individually directed into a summation block which calculates the first moments of the individual vectors and toggles the sign designation bit of the current vector depending on whether all the bits in that particular vector had to be inverted or not with the thrust being to continuously drive the accumulated first moments of the individual input vectors in the direction of zero. If the addition of the current vector's first moment to the total accumulated running sum of all first moments effectively drives this value in a direction away from zero, the value of the first moment of the current vector is negated and then added to the accumulated running sum. Also in this instance, the bits of the vector are inverted and the sign-bit, appended previously to the vector, is toggled to indicate upon decoding that the bits of this vector have been inverted. The individual vectors output from the summation function are stacked into an output array. Subsequent to the output of the last input vector from the summation function, the total running sum is passed to a final function block wherein a last balanced vector is produced and appended to the output data array. The overall result is asymptotically optimal for second order DC-constrained channels.

In order to achieve this, attention is directed to FIG. 1 illustrating the encoder of the present invention generally designated as 10, which is divided into 4 distinct blocks, designated as 12, 14, 16, and 18, respectively, which perform separate functions on the input data sequence 15 to produce the $DC^2$-constrained data array at the output composed of array 40 and appended vector 42. The first block 42 of encoder 10 breaks the long data stream of bits into equal sized vectors and adds a sign-bit to each vector. The output of encoder block 12 is fed directly into block 14, wherein the equal sized vectors are balanced. The balanced vectors at the output of block 14 are then passed directly into the summation block 16, wherein the accumulated first moments of the individual vectors are tracked and the sign designation bit which was appended to each input data vector is toggled depending on whether all the bits in that particular vector were inverted or not by the function of block 16 upon output therefrom. The accumulated vector output of summation block 16 forms output data array 40. A summation value is also output to block 18, wherein that summation value is used for encoding a single vector. This last vector is appended to the output encoded array 40. The final output data array comprising array 40 and appended vector 42 is second order DC-balanced.

Figure 2:
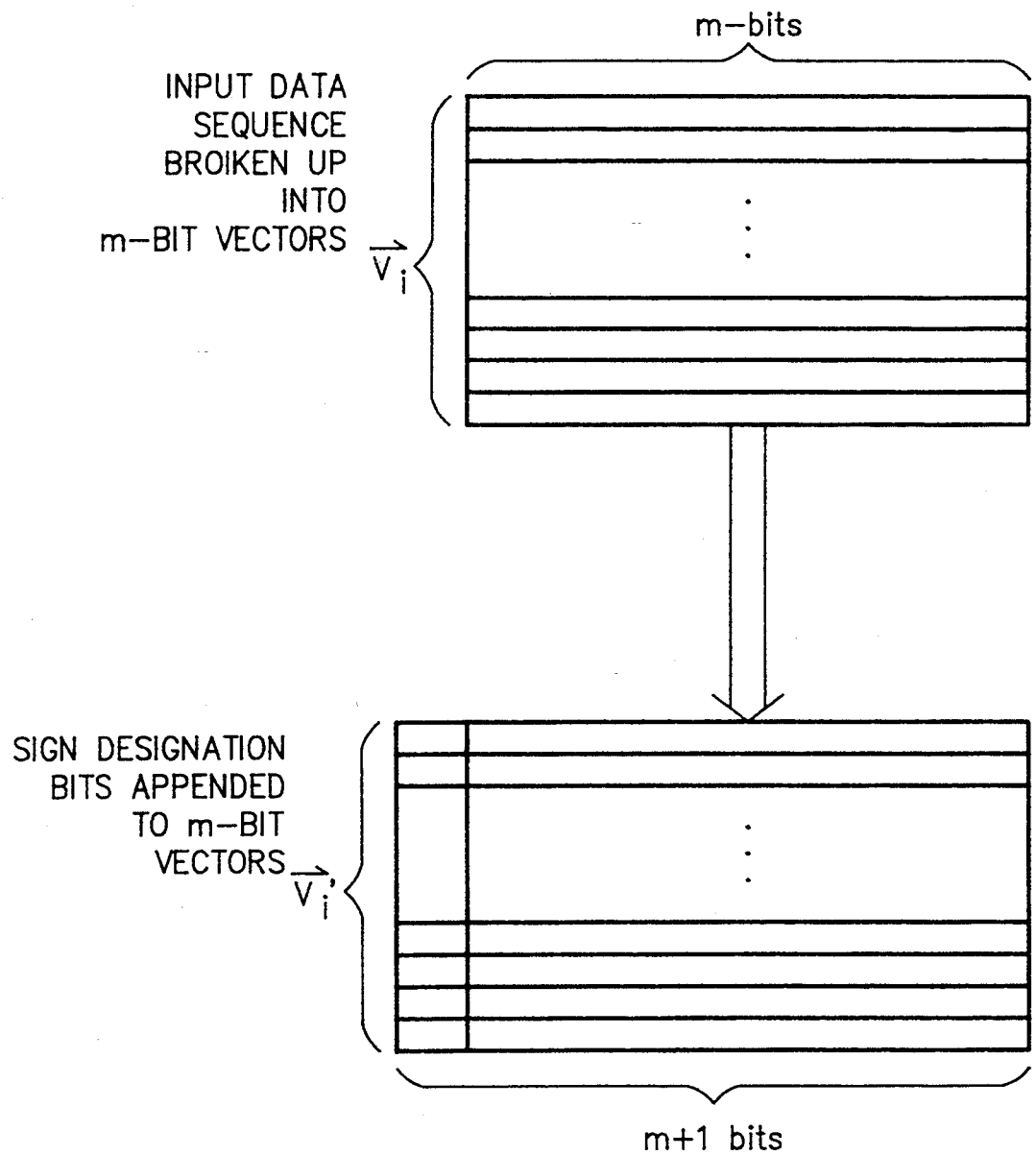
FIG. 2 is an illustration of the vectored input data sequence of FIG. 1 in the first block of the encoder of the present invention wherein the input data sequence is broken into equal sized vectors and a sign bit designator is added to each vector.

With respect to the first block 12 of the encoder of the present invention, attention is directed to FIG. 2 illustrating the vectored input data sequence 15 shown in FIG. 1. In the first block 12 of the preferred embodiment, the input data sequence to be encoded must be broken into individual vectors, designated in FIG. 2 as $\vec{v}_i$, each of length m. It is important that the individual component vectors have the same length because of $m \times n$ array must be established for further processing in block 14. This vectoring function can be readily achieved by an implementation of a digital counter mechanism. This mechanism is not shown but is commonly found in the arts as either hardware or software means which effectively takes a bipolar input sequence and, on specific clock cycles, breaks the input binary sequence into sequences (or vectors) of a predetermined length. Depending on the system wherein the present encoder finds its intended uses, a software implementation of this function may be preferable as the means to vector the input data sequence because of the simplicity of the software required to achieve this operation.

However, before the completed vectored input sequence is directed to the balancing block 14 and in accordance with the preferred embodiment of the present invention, the individual vectors must be further transposed into an equal number of vectors of length $m+1$, as is shown in FIG. 2. This is achieved by appending to each vector a single sign designation bit which is later used as a sign-bit by the summation block of the present encoder to track whether that particular vector has been inverted or not. Any predetermined sign-bit which can be used to indicate whether any particular vector has been inverted or not could be employed.

The completed array of vectors can either be individually stored temporarily in an addressable memory means associated therewith or they can be sequentially passed as vectors directly into the block 14 and accumulated there for balancing. Preferably, the completed vectors of length $m+1$ are clocked directly into the balancing block and accumulated there in order to minimize the overhead associated with the storage of the entire set of vectors in block 12.

It should be noted that the present encoder will also achieve its stated objectives if the input data sequence which is initially directed into block 12 is already in an array form. In the case wherein the data sequence desired to be directed into the present encoder is already in array form, the input could be either first transposed back into a long data sequence in advance of entering block 12 or, it is envisioned, that a flagging means could be implemented within the vectoring function 12 which causes the vectoring of the bipolar input sequence to be by-passed in the case of an array input, such that the input array is directed to the operation therein of appending to each vector of the input array a sign designation bit before proceeding to balancing block 14.

All the vectors in the accumulated array have to then be balanced which is the function of block 14 of the present encoder. A complete discussion as to the effectuation of this balancing operation is omitted herein for the simple fact that this balancing operation is well-known in this art and one already skilled in this particular art should readily understand the functional operation of balancing. However, attenuation is directed to U.S. Pat. No. 4,309,694, "Zero Disparity Coding System", issued to Henry on Jan. 5, 1982, which is hereby incorporated by reference to help facilitate the technique of array balancing. Attention is also directed to the paper, "Efficient Balanced Codes", by Knuth, IEEE Transactions on Information Theory, Vol. 32, pp. 51–53, (1986) which may very well serve to provide a deeper understanding of the techniques put forth in the above patent to Henry.

Figure 3:
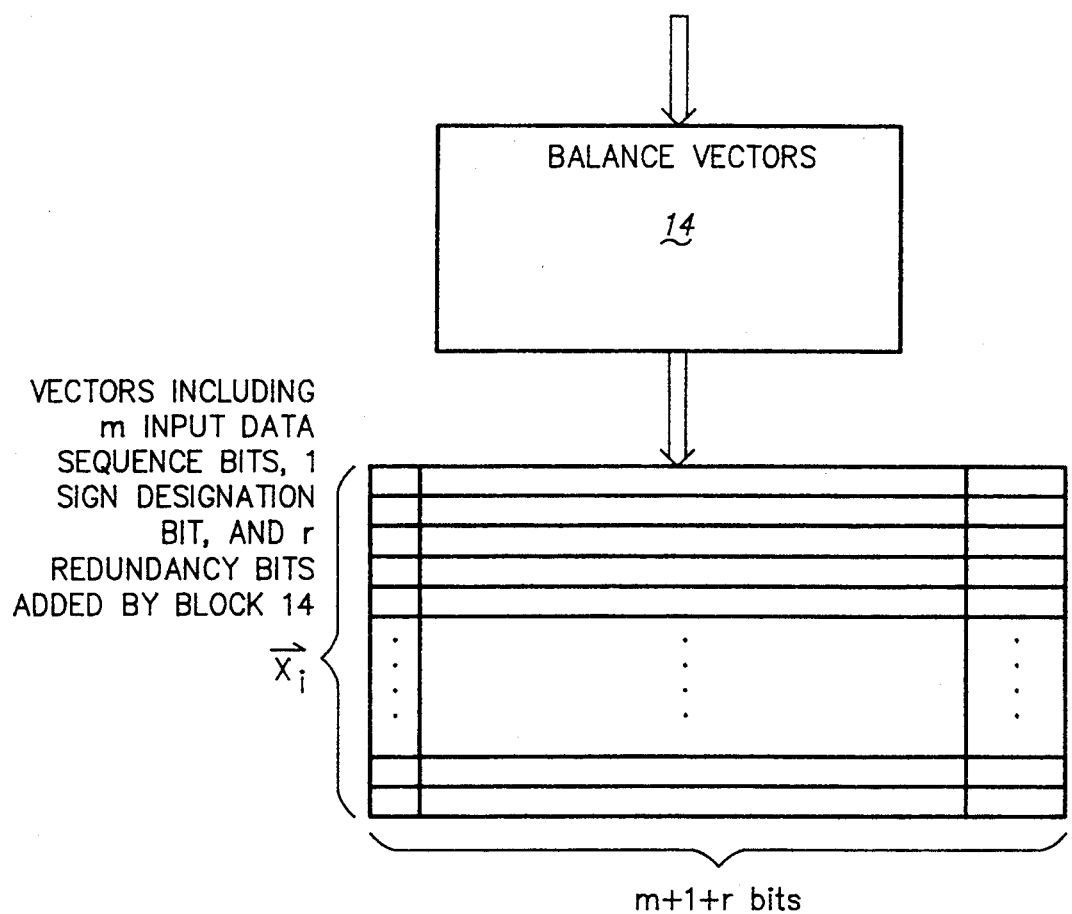
FIG. 3 is an illustration of the balanced array output from the balancing block 14 of the encoder of FIG. 1.

As shown in FIG. 3, the balanced output array which is output as a function of block 14 is of size $m+1+r$ where $m+1$ is the size of the input array of size m after appending the single sign-bit and r is the size of the redundancy bits which were appended to the input array as a function of the balancing operation. The output array of FIG. 3 is composed of individual vectors designated herein as $\vec{x}_i$.

The output balanced array thus will have vectors of length $m+1+r$ where r is the number of redundancy bits appended as a function of the balancing operation. This balanced array is then passed preferably to block 16, balanced vector by balanced vector.

Figure 4:
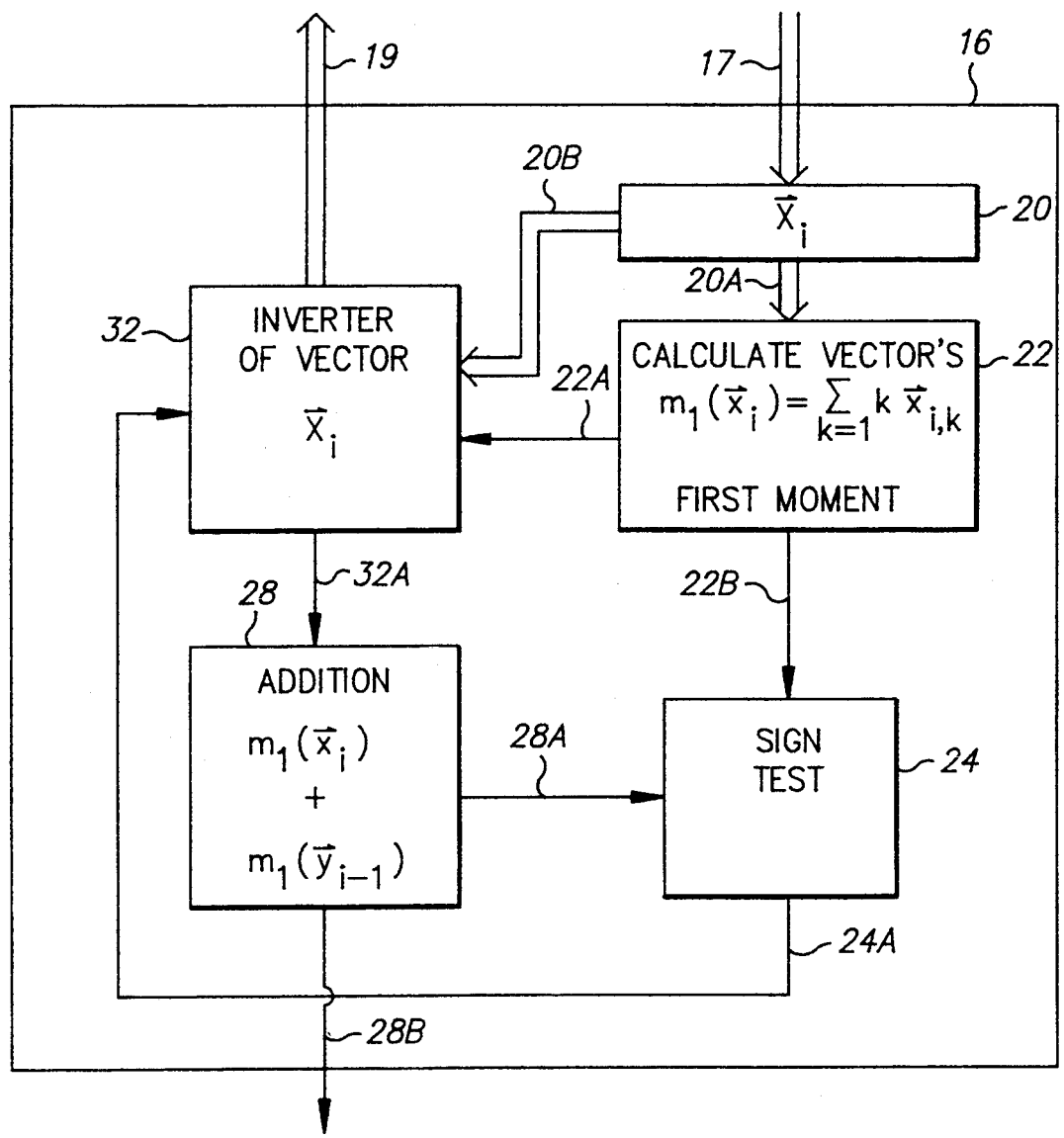
FIG. 4 is a functional schematic block diagram of the summation function block of the encoder of FIG. 1 illustrating the operation of calculation and tracking the accumulated first moments of the individual vectors.

With respect to the summation function block 16 of the present invention, attention is directed to FIG. 4 illustrating the operation of calculating and tracking the accumulated first moments of the individual vectors. What is important to understand at this point is that the addition of the value of the first moment $m_1(\vec{x}_i)$ of any single vector $\vec{x}_i$ to the accumulated running sum $m_1(\vec{y}_{i-1})$ of all the first moments helps drive the value of the accumulated running sum in the direction of zero. These instances are when then value of the running sum is less than zero and the value of the first moment of the next vector is greater than zero wherein the addition of the two values in actuality drives the running sum in the direction of zero, and in the instance when the value of the accumulated running sum is greater than zero and the value of the first moment of the next vector is less than zero wherein the addition of these two values also helps drive the value of the running sum in the direction of zero. In other words, when the sign of the value of the running sum $m_1(\vec{y}_{i-1})$ and the sign of the value of the first moment $m_1(\vec{x}_i)$ of the next vector $\vec{x}_i$ are different from each other than the addition of these two values drives the overall running sum in the direction of zero from either direction. This is part of what the overall function of the summation block 16 is effectuating.

To accomplish this, first the vectors of the balanced array output by block 14 are fed into block 16 over input bus 17 clocked vector by vector. One by one the balanced input vectors $\vec{x}_i$ are deposited in a temporary storage unit 20, wherein that vector is then directed into first moment function block 22 over bus 20A, wherein the value of this particular vector's first moment $m_1(\vec{x}_i)$ is determined by the relationship:

$$\sum_{k=1}^{m+1+r} k\vec{x}_{i,k}$$

wherein k indexes through all the bits comprising vector $\vec{x}_i$ such that the first moment of each k-th bit position of vector $\vec{x}_i$ is computed as a running sum over all k. One skilled in this art should understand the operation of determining the values of the first moment of a vector.

Once the first moment $m_1(\vec{x}_i)$ of the vector $\vec{x}_i$ has been determined, the operation within this block has completed. In other words, the value of the first moment for this vector has been determined. The output of the value of the first moment $m_1(\vec{x}_i)$ is then directed over output lines 22A and 22B to inverter unit 32 and sign-test unit 24, respectively.

The sign-test unit 24 takes two inputs. One input is line 28A from the accumulator function block 28 and the other is line 22B coming from first moment function block 22 passing the sign of the calculated value of the first moment of the current vector. Note that if either the accumulated running sum $m_1(\vec{y}_{i-1})$ or the first moment of the current vector $m_1(\vec{x}_i)$ is equal to zero, then it's sign is taken as positive by choice of a convention. As discussed above, the purpose here is to determine whether the sign of the running accumulated sum $m_1(\vec{y}_{i-1})$ is equal to the sign of the first moment $m_1(\vec{x}_i)$ of the current vector $\vec{x}_i$ or not. This is accomplished by multiplying the two sign values at the input to the sign-test unit 24. If the resulting value is negative then the running sum and the value of the first moment of the current vector are of opposite signs and thus the addition of these two values further drives the accumulated running sum in the direction of zero. In this instance, output line 24A signals the inverter unit 32 not to invert the value of the first moment $m_1(\vec{x}_i)$ before forwarding this value to the accumulated running sum block 28 over line 32A for addition thereto. In this case, line 24A also signals the inverter 32 not to invert the bits of vector $\vec{x}_i$ before its output over bus 19 and, thus, not toggle the sign-designation bit signalling that the bits of this vector have not been inverted. On the other hand, if the result of the sign-test in block 24 is positive, which means that the addition of this first moment value to the accumulated running sum drives the running total away from zero, then line 24A signals the inverter 32 to invert the value of the first moment $m_1(\vec{x}_i)$ before forwarding it to the accumulator function block 28 over line 32A for addition to the value of the total running accumulated sum $m_1(\vec{y}_{i-1})$. In this case, line 24A also signals the inverter 32 that the value of this vector's first moment has been inverted and the entire vector needs to be inverted in advance of its output to become part of the output data array. In this instance, all the bits comprising the vector $\vec{x}_i$ over the bipolar alphabet $\{-,+\}$ have to be inverted and the sign-designation bit for this vector needs to be toggled to indicate upon decoding that the bits of this vector have been inverted. In such a fashion, cycle by cycle the vectors are input into the register 20 from the balancing block over bus 17 and eventually output from the summation block unit over bus 19 for appending to the final output array.

Once all the first moments of all the input balanced vectors have been determined and the running sum has completed accumulating the total for all the input vectors, (i.e., having performed the function of inverting or not inverting so as to keep driving the total value of the running accumulated sum towards zero), the accumulator block 28 outputs the accumulated total value $m_1(\vec{y}_m)$ to the function block 18 over line 28B.

Figure 5:
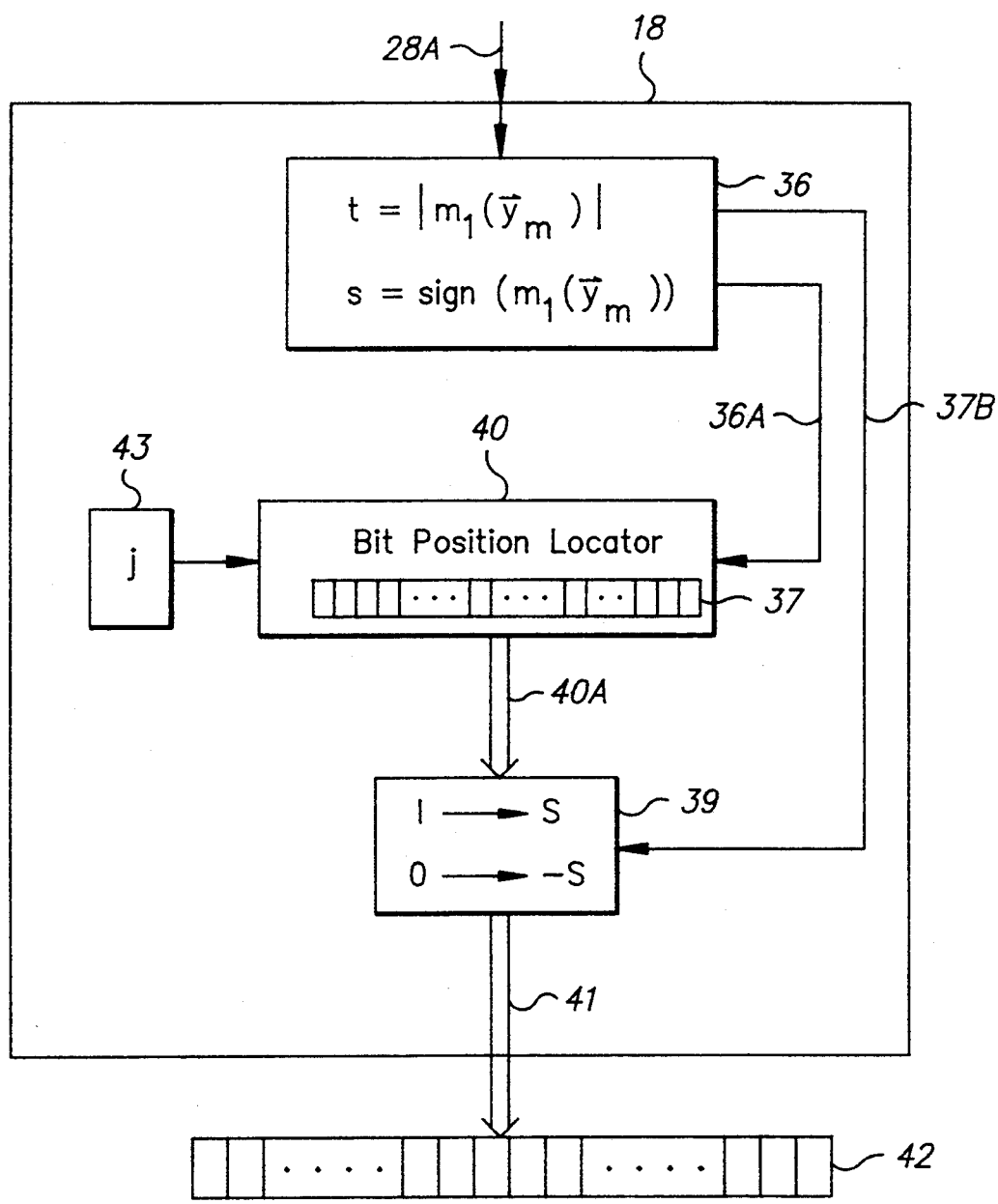
FIG. 5 is a schematic block diagram of the last function block of the encoder of FIG. 1 wherein the summation information is converted into a vector to be appended as a last row in the final output $DC^2$-constrained array.

With respect to the fourth function block 18, attention is now directed to FIG. 5 illustrating the functional components of this block structure. As discussed above, the value of the running accumulation of the total moments of all the individual vectors is directed into function block 18 over line 28A and, in particular, into block 36, wherein the absolute value of the accumulated total first moment running sum is assigned to t and the sign of the moment value is assigned to s. More specifically, $t = m_1(\bar{y}_n)$ and $s = \text{SIGN}(m_1(\bar{y}_n))$. The value of t is directed over line 36A into position location function block 40 and the value of s is directed over line 36B into bit-sign function block 39. What is important to understand here is that a vector must be made and appended as the last vector to the output data array 40 constructed at the output of summation block 16 with the right value of a first moment which effectively drives the entire value of the accumulated total first moment of the output data array to zero.

This is achieved by a technique which produces a specific balanced sequence from a starting vector, designated as 37 in block 40, which is itself balanced vector over the same bipolar alphabet as the other vectors. Starting vector 37 is constructed such that it has the highest moment possible for a vector of that length. Given this starting vector, the position location function 40 locates the bit positions within the starting vector which have to be flipped in order for the first moment of that final vector to be such that it drives the total first moment of the output array to zero when appended thereto. Block 40 achieves its position locator function by evaluating the following condition:

$$(j \leq Q) \oplus \left( j \geq \left( \frac{N}{2} + Q + 2 \right) \right) \oplus \left( j = \frac{N}{2} + Q + 1 - P \right)$$

where $\oplus$ denotes the boolean OR operation and $$N = m + 1 + r, \; Q = \text{FLOOR}\left( \left| \frac{t}{n} \right| \right),$$

and $P = \frac{1}{2}(t - QN)$.

Thus, an index counter j of block 43 increments through all the positions of the starting vector 37, for each location in this vector, a boolean function is determined based upon the position j within the vector and the values of t, N, and Q. The bit position location function 40 preferably uses a boolean marking (1,0) system such that a 1 is directed into bit position j if the boolean condition at that bit location evaluates to TRUE. Conversely, a 0 is placed within the starting vector 37 at position j if the boolean condition at that bit position evaluates to FALSE. What remains after the index counter j has cycled through all the bit positions of the starting vector 37, is a vector with 1's and 0's as markers in the various bit positions. This marked starting vector 37 is then passed to sign bit function 39 over line 40A, wherein at each bit location of a 1 in the starting vector 37 is replaced by an "s" symbol from the bipolar alphabet (which in this case may be either a + or a − depending on the sign of $m_1(y_n)$). Likewise, each marked location of a 0 in vector 37 is replaced by an "−s" symbol. Once the boolean bit markers in the various locations of starting vector 37 have been replaced by the corresponding symbols over the chosen bipolar alphabet, the entire vector is output over bus 41 as last vector 42 to be appended to the final output data array 40 as last vector. Upon completion of the encoding of the present invention, the final output data array then consists of array 40 with the appended vector 42. This final output array is second order DC-free.

In summary of the construction of the preferred embodiment herein, an encoding apparatus for constructing an asymptotically optimal coding scheme for second order DC-constrained channels is disclosed. The construction involves the encoding of an input data sequence over preselected bipolar binary alphabet, preferably $\{+,-\}$. A first encoding function block breaks the input data stream into equal sized vectors of length m bits. A sign designation bit is then attached to each vector to make vectors of length m+1 bits. These vectors are then directed to a balancing function wherein the vectors are balanced using the techniques disclosed by Henry. The output balanced array is thus composed of balanced vectors of length m+1+r bits where r is the number of redundancy bits appended to effectuate the balancing. The individual vectors comprising the balanced array of vectors are then individually directed into a summation block which calculates the first moment of a vector. A determination is made whether the addition of this vector's first moment value to an accumulated running sum of all the vectors' first moments effectively drives the running sum in the direction of zero. If is does then that vector's first moment is added to the accumulated running sum of first moments and the vector is added to the output array 40. If on the other hand the addition of a vector's calculated first moment to the accumulated running sum of first moments effectively drives the total running sum value in a direction away from zero then the value of that vector's first moment is inverted before being added to the accumulated running sum so as to effectively drive the accumulated running sum in the direction of zero. At the same time, the individual bits of this vector get inverted, i.e. switched to the other symbol of the selected bipolar alphabet, and the sign designation bit of that vector gets toggled so as to indicate upon decoding that the bits of this vector have been inverted. The encoder then clocks in the next balanced vector from the balancing block function and repeats this encoding process until all the first moments of all the individual vectors of the balanced array have been calculated and a total accumulated running sum of all the first moments has been determined with the intention of always attempting to drive the total accumulated running sum value of all the vectors in the direction of zero so that, upon completion of the encoding of the entire balanced array, the total accumulated running sum is as close to zero as possible. The value of the total running sum is passed to a final function block wherein a last balanced vector is produced using the present technique which is created specifically to have a first moment value, which when added to the value of the total accumulated running first moment sum, achieves the result of driving the final first moment sum to zero. This vector 42 is then appended to the output data array 40. The output array is then second-order DC-free, and the above described encoder is asymptotically optimal for second-order DC-constrained channels.

The decoder of the present invention is the reverse of the above described encoding, but much simpler. The received sequence to be decoded is first partitioned into blocks of length m+1+r bits long in order to reassemble the original encoded output array 40. The information vectors encoded therein are then retrieved by the removal of the final vector 42 which was appended to the output array 40 at the end of the encoding step. The sign designation bit is then checked to determine whether the bits of a particular vector have been inverted or not. If the sign bit indicates that the bits of a vector have been inverted then the bits of that vector are inverted again to produce the vector's original bit sequence prior to inversion during encoding. If the sign bit indicates that the bits have not been inverted then no inverting is done to the vector. The sign bits are checked for all vectors. Once those vectors requiring bit inversion have been inverted, the balancing of the array is undone. The sign designation bit of each vector is subsequently stripped off and the r redundancy bits removed if they haven't already been removed by the decoding of the balancing. The original information vectors of length m bits are then retrieved.

The following is a discussion of the mathematical relationships which are provided herein to support the above assertions that the output data array of the present encoder achieves its stated objectives. In order to follow the mathematical relationships herein an embodiment will be discussed in conjunction with this supporting text which is directed to the construction of two second order DC-free codes with codewords of length 4104 and 65520, respectively. The first code has information rate 0.865 and requires a lookup table of size 68 bits$\times$8 bits$=$68 bytes, while the second code has information rate 0.953 and requires a lookup table of size 250 bits$\times$10 bits$\cong$313 bytes. To begin, a typical codeword of code $C_1$ can be given as:

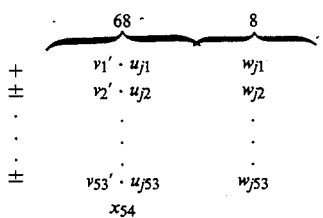

A lookup table for the vectors $\vec{w}_j$ corresponding to the index j can be ordered lexicographically as shown:

| 1 | 00001111 | 15 | 00111100 | 29 | 01101001 | 43 | 10011001 | 57 | 11000101 |
|---|---|---|---|---|---|---|---|---|---|
| 2 | 00010111 | 16 | 01000111 | 30 | 01101010 | 44 | 10011010 | 58 | 11000110 |
| 3 | 00011011 | 17 | 01001011 | 31 | 01101100 | 45 | 10011100 | 59 | 11001001 |
| 4 | 00011101 | 18 | 01001101 | 32 | 01110001 | 46 | 10100011 | 60 | 11001010 |
| 5 | 00011110 | 19 | 01001110 | 33 | 01110010 | 47 | 10100101 | 61 | 11001100 |
| 6 | 00100111 | 20 | 01010011 | 34 | 01110100 | 48 | 10100110 | 62 | 11010001 |
| 7 | 00101011 | 21 | 01010101 | 35 | 01111000 | 49 | 10101001 | 63 | 11010010 |
| 8 | 00101101 | 22 | 01010110 | 36 | 10000111 | 50 | 10101010 | 64 | 11010100 |
| 9 | 00101110 | 23 | 01011001 | 37 | 10001011 | 51 | 10101100 | 65 | 11011000 |
| 10 | 00110011 | 24 | 01011010 | 38 | 10001101 | 52 | 10110001 | 66 | 11100001 |
| 11 | 00110101 | 25 | 01011100 | 39 | 10001110 | 53 | 10110010 | 67 | 11100010 |
| 12 | 00110110 | 26 | 01100011 | 40 | 10010011 | 54 | 10110100 | 68 | 11100100 |
| 13 | 00111001 | 27 | 01100101 | 41 | 10010101 | 55 | 10111000 | | |
| 14 | 00111010 | 28 | 01100110 | 42 | 10010110 | 56 | 11000011 | | |

Such lexicographic ordering allows for simple decoding.

With respect to balancing, let the vectors $\vec{v}_1, \vec{v}_2, \ldots, \vec{v}_n$ be a set of arbitrary information vectors of length m, where m is odd. First, each $\vec{v}_i$ must be extended by an extra coordinate fixed at $+1$ in order to obtain $\vec{v}'_i = (+ \cdot | \vec{v}_i)$, where $(\cdot | \cdot)$ denotes the concatenation operation. Subsequently, each vector $\vec{v}'_i$ is encoded into a balanced vector $\vec{x}_i$ using the balancing techniques of Knuth which employs the well-known balancing set of vectors as given by:

$$U_{m+1} = \left\{ u_i = (\underbrace{+++\ldots+++}_{i}\underbrace{---\ldots---}_{m+1-i}) : 1 \leq i \leq m+1 \right\}$$

It can be shown that there always exists a vector $\vec{u}_j \in U_{m+1}$ such that $\vec{v}'_i \cdot \vec{u}_j$ is balanced, where the symbol $\cdot$ stands for the arithmetic operation of bit by bit multiplication. In order to complete the encoding, the index j must be represented by a vector $\vec{w}_j \in S^0_r$. Such representation is always possible provided $|S^0_r| \geq |U_{m+1}|$, that is $$\binom{r}{r/2} \geq m + 1.$$

For the purposes of the preferred embodiment, it is also required that (m+1+r) by divisible be 4. If the largest possible information length m for a given redundancy r is taken, namely $$m = \binom{r}{r/2} - 1,$$

then $m+1+r \equiv 0 \mod 4$ if and only if $r \equiv 0 \mod 4$ and r is not a power of 2.

Given the vector $\vec{x} = (x_1, x_2, \ldots, x_n)$, let $\vec{\bar{x}} = (\bar{x}_1, \bar{x}_2, \ldots, \bar{x}_n)$ denote the complement of vector $\vec{x}$. After balancing, the balanced vector $\vec{x}_i$ corresponding to the information vector $\vec{v}_i$ can be given by $\vec{x}_i = (\vec{v}'_i \cdot \vec{u}_j | \vec{w}_j)$. Note that by construction of the first coordinate of $\vec{x}_i$ is $+1$ whereas the first coordinate of $\vec{\bar{x}}_i$ is $-1$.

With respect to the accumulation aspects of the present encoder, if one sets $\vec{y}_1 = \vec{x}_1$ then for $i = 2, 3, \ldots, n$ the vector $\vec{y}_i$ can be defined as:

$$\vec{y}_i = \begin{cases} (\vec{y}_{i-1} | \vec{x}_i) & \text{if } m_1(\vec{y}_{i-1}) \, m_1(\vec{x}_i) \leq 0 \\ (\vec{y}_{i-1} | \vec{\bar{x}}_i) & \text{if } m_1(\vec{y}_{i-1}) \, m_1(\vec{x}_i) > 0 \end{cases} \quad \text{Eq. 3}$$

Since all the vectors $x_i$ are balanced and $m_1(\vec{\bar{x}}_i) = -m_1(\vec{x}_i)$, it follows from a position independence property that $m_1(\vec{y}_n) = m_1(\vec{x}_1) \pm m_1(\vec{x}_2) \pm \ldots \pm m_1(\vec{x}_n)$. Position independence herein is a property wherein it is stated that if vector $\vec{x} \in S^0_n$ is contained in vector $\vec{y}$ at position j then the contribution of vector $\vec{x}$ to the first moment of $\vec{y}$ is $m_1(\vec{x})$, irrespective of the position j, and can be shown by the following. Consider the contribution of $\vec{x}$ to the first moment of $\vec{y}$ which is given by:

$$\Delta(\vec{x},\vec{y}) = \sum_{i=1}^{n} (j + i - 1)x_i =$$

$$(j-1)\sum_{i=1}^{n} x_i + \sum_{i=1}^{n} ix_i = (j-1)m_0(\vec{x}) + m_1(\vec{x}).$$

If $\vec{x} \in S^0_n$ then $m_0(\vec{x})=0$, and $\Delta(\vec{x},\vec{y})=m_1(\vec{x})$. Therefore, the contribution of $\vec{x}$ to the first moment of $\vec{y}$ is $m_1(\vec{x})$, irrespective of j and thus is position independent.

Hence, the use of a polarity inversion technique as disclosed and implemented herein insures that $-M(1,m+1+r) \leq m_1(\vec{y}_n) \leq M(1,m+1+r)$, where $M(1,n) = \max_{\vec{x} \in S^0_n} m_1(\vec{x})$ is the maximum value of the first moment of a balanced sequence of length n. Further, it can be shown that:

$$M(1,n) = \sum_{i=\frac{n}{2}+1}^{n} i - \sum_{i=1}^{\frac{n}{2}} i = \frac{n^2}{4}$$

It can be seen that if $m+1+r \equiv 0 \mod 4$, then $m_1(y)$ is even.

Lastly, with respect to the creation of the final vector to be appended to the output array 40 of FIG. 1, in order to obtain the binary code C with a second order spectral null at frequency $\omega_0 = 0$, it is required to show that there exists a balanced vector $\vec{x}$ with $m_1(\vec{x}) = -m_1(\vec{y}_n)$.

To show this, the following proposition is put forward. Let $n \equiv 0 \mod 4$. Then, for any even integer t with $|t| \leq M(1,n)$, there exists a balanced vector $\vec{x} \in S^0_n$ such that $m_1(\vec{x}) = t$.

The proof is as follows. Let the vector $\vec{x} = (x_1, x_2, \ldots, x_n)$, and assume that either $(-,+)$ or $(+,-)$ is contained in vector $\vec{x}$ at position j, and define $F_j\vec{x} = (x_1, x_2, \ldots, -x_{j+1}, \ldots, x_n)$, wherein the effect of the flip operator $F_j$ amounts to interchanging the positions of $+$ and $-$ in the coordinates j and j+1. Now set $\vec{x}_0 = (--\ldots--++\ldots++)$, where the two sequences of $-1$ and $+1$ are both of length n/2. It should be clear then that $m_0(\vec{x}_0) = 0$ and $m_1(\vec{x}_0) = M(1,n)$. Furthermore, vector $\vec{x}_0$ contains $(-,+)$ at position n/2. For $i = 1, 2, \ldots, M(1,n)$, let $\vec{x}_i = F_j\vec{x}_{i-1}$, where j is the smallest index such that the vector $(-,+)$ is contained in $\vec{x}_{i-1}$ at position j. To see that such a position exists, note that the only vector in the set $S^0_n$ that does not contain $(-,+)$ is $\vec{x}_0 = (++\ldots++--\ldots--)$. The following shows that all the vectors $\vec{x}_i$ are in the set $S^0_n$, and $\vec{x}_i \neq \vec{x}_0$ for $i < M(1,n)$. Indeed, $$m_0(\vec{x}_i) = m_0(\vec{x}_{i-1}) = m_0(\vec{x}_0) = 0$$

$$m_1(\vec{x}_i) =$$

$$m_1(\vec{x}_{i-1}) + 2j - 2(j+1) = m_1(\vec{x}_{i-1}) - 2 = m_1(\vec{x}_0) - 2i$$

Hence, $\vec{x}_i \in S^0_n$ for all i.

Further, all the vectors $\vec{x}_i$ are distinct and $m_1(\vec{x}_{M(1,n)}) = -M(1,n)$. Therefore, $\vec{x}_{M(1,n)} = \vec{x}_0$ and $\vec{x}_i \neq \vec{x}_0$ for $i < M(1,n)$, It follows therefrom that, as the index i varies from 0 to $M(1,n)$, the first moment of $\vec{x}_i$ takes on all the even values in the range $+M(1,n)$ to $-M(1,n)$. As an application of the proposition put forth above that for any even integer t with $|t| \leq M(1,n)$ there exists a balanced vector $\vec{x} \in S^0_n$ such that $m_1(\vec{x}) = t$, a balanced vector $\vec{x}_{n+1}$ of length $(m+1+r)$ can be readily constructed such that $m_1(\vec{x}_{n+1}) = -m_1(\vec{y}_n)$, where $\vec{y}_n$ is as defined in Eq. 3.

In view of the first proposition as put forth above, the concatenated vector $\vec{y} = (\vec{y}_n | \vec{x}_{n+1})$ satisfies $m_0(\vec{y}) = m_1(\vec{y}) = 0$, and hence is second order balanced. Thus, the binary code C consisting of all the vectors of length $(n+1)(m+1+r)$ obtained using this construction has a second order spectral null at $\omega_0 = 0$.

Let $R(C)$ denote the rate of the binary code C resulting from the foregoing construction. Then:

$$R(C) = \frac{\log|C|}{(n+1)(m+1+r)} = \frac{nm}{(n+1)(m+1+r)}$$

Since r approaches $\log(m)$ as $m \to \infty$ it should be understood at this point that $$\lim_{n,m \to \infty} R(C) = 1.$$

Thus, the binary code C asymptotically achieves the capacity of the second order spectral null channel. The encoder for code C is straightforward. Finding the vector $\vec{u}_j \in U_{m+1}$ such that $\vec{v}'_j \vec{u}_j \in S^0_{m+1}$ is equivalent to successively complementing the bits of $\vec{v}'_i$ until the resulting vector is balanced. The number of complemented bits is the index j. If m is not too large, the encoding of j into $w_j \in S^0_r$ may be accomplished by means of a lookup table of size $(m+1) \times r$.

Once the encoding of the individual vector $\vec{x}_i = (\vec{v}'_j \vec{u}_j | \vec{w}_j)$ is complete, $\vec{x}_i$ may be transferred to the output. The encoding delay is essentially only $m+1+r$ bits.

The present invention lends itself readily to a noiseless channel decoder, as described above, for a given second order DC-free input channel code C thereby retrieving the original information vectors $\vec{v}_1, \vec{v}_2, \ldots, \vec{v}_n$. In effect, the present encoding apparatus produces a noiseless channel decoder such that, if channel errors occur, the length of the channel error propagation is bounded to a small fraction of the codeword length n since the present construction operates on essentially independent information blocks of length $m \leq n$.

The discussion above has been specifically directed to the construction of two second order DC-free codes $C_1$ and $C_2$ of lengths 4104 and 65520, respectively. The first of these codes, $C_1$, corresponds to redundancy $r=8$ and hence requires a lookup table which is only a single byte wide. Since there are 70 balanced vectors of length 8 (1 byte) and since $(m+1+r)$ must be divisible by 4, (recall that if the largest possible information length m for a given redundancy r is taken, namely $$m = \binom{r}{r/2} - 1,$$

then $m+1+r \equiv 0 \mod 4$ if and only if $r \equiv 0 \mod 4$ and r is not a power of 2), the maximum possible information length for this construction is length $m=67$. The number n of information blocks of length m to be encoded in a single codeword is preferably chosen to simultaneously maximize the code rate and obtain codewords of length close to a power of 2. Preferably, the number of information blocks n=53 is chosen in order to make the codewords of the code $C_1$ 513 bytes long. As such, the information rate of the code $C_1$ is given by $$R_1 = \frac{53}{54} \cdot \frac{67}{76} \simeq 0.86525.$$

If a higher information rate is required by the specific application to which the present invention is being implemented, it is preferable to use a redundancy r=10 in order to provide a total of 252 balanced vectors which in turn necessitates a lookup table that is only 10 bits wide. Another preferable selection of parameters m,n for redundancy r=10 is length m=249 and n=251 information blocks. In this instance, the resulting code $C_2$ has a total length of 65520 bits (8190 bytes) and has an information rate $$R_2 = \frac{251}{252} \cdot \frac{249}{260} \simeq 0.95389.$$

The present encoder is such that if channel errors occur during transmission the length of the channel error propagation is bounded to a small fraction of the codeword length since the present construction operates an essentially independent information blocks (vectors) of a fixed length.

In summary, an apparatus is disclosed and claimed herein which effectively and efficiently constructs asymptotically optimal second order DC-free channel codes. A decoder is also disclosed. The techniques herein are easily and readily amenable to relatively simple hardware and/or software implementations without requiring the large lookup tables, and more importantly, these techniques effectively achieve information rates arbitrarily close to 1.

It should be understood that it is envisioned herein that the construction of the present invention will be extended to codes having a second order spectral null at frequency ½ rather than zero frequency, as discussed above. The extension to a spectral null at any arbitrarily predetermined frequency and, more precisely, any rational sub-multiple of the symbol frequency may be obtained by an interleaving technique commonly found in the arts. In addition, although the discussion herein was specifically directed to the case wherein K=2 (where K denotes the order of the spectral null), the generalization and extension of these techniques to higher order DC-free codes is considered herein to be within the scope of the present invention.

It is also envisioned herein that the present invention will find its intended uses in digital communication transmission and reception equipment and in digital data storage and retrieval devices in addition to optical fiber networks with very high data transmission rates. Although mathematically complex, the techniques disclosed and claimed herein, when taken in conjunction with the accompanying drawings, are such that one skilled in the art would be able to implement and/or adapt the present encoder to their specific environment wherein it is their objective to overcome similar problems in the arts as to those put forth in the background above. Thus, it should be understood that this invention may be embodied in other specific forms without departing from its spirit or essential characteristics and that the above-described embodiment of the present invention is to be considered in all respects only as illustrative and not restrictive in scope. The scope of the invention is therefore indicated by the appended claims rather than by the above-detailed description. As such, all changes which come within the meaning and range of equivalency of the claims are to be considered embraced within their scope.

What is claimed and desired to be secured by United States Letters Patent is:

1. An apparatus for encoding a second order DC-free output array, comprising:
   a) means for balancing each vector in a first array of vectors to be second order DC-constrained; and
   b) means for constructing a second order DC-constrained final output array, the means for constructing including:
      means for calculating a first moment value for a balanced vector,
      means for maintaining an accumulated sum of first moments of balanced vectors; and
      means for determining whether the addition of a vector's first moment value to the accumulated sum of first moments drives the accumulated sum of the first moments in a direction toward zero or away from zero.

2. An apparatus for encoding as defined in claim 1 wherein said means for accumulating an accumulated sum of first moments includes means for adding said calculated first moment value to said accumulated sum of first moments.

3. An apparatus for encoding as defined in claim 1 further comprising:
   a) means for inverting said first moment value prior to addition, if the addition thereof to said accumulated sum of first moments effectively drives the accumulated sum of first moments in a direction away from zero; and
   b) means for inverting the bits of said balanced vector in the case wherein the first moment value has been inverted prior to addition thereof to the accumulated sum value.

4. An apparatus for encoding as defined in claim 1 further comprising:
   a) means for appending a sign-bit to each vector of said first array; and
   b) means for toggling said sign-bit to indicate bit inversion if said determined direction of the addition of a vector's first moment value to said accumulated sum of first moments is away from zero.

5. An apparatus for encoding as defined in claim 1 further comprising:
   a) means for producing a last balanced vector derived from said accumulated sum of first moments; and
   b) means for appending said last balanced vector to said final output array.

6. An encoding apparatus for constructing a second order DC-free channel code from an input data sequence over a bipolar binary alphabet, and comprising:
   a) means for appending to each input vector of length m of a first input array a sign-bit so as to produce a first output array of equal length vectors of size m+1;
   b) means for balancing each vector in said first output array of vectors of size m+1 by appending r redundancy bits, so as to produce a second output array of balanced vectors each of size m+1+r;
   c) means for computing a first moment for each of the balanced vectors; and d) means for accumulating an accumulated sum of first moments of the individual balanced vectors $\vec{x}_i$ of the second output array, said means for accumulating including for driving the accumulated sum in the direction of zero so as to produce a final output array which is second order DC-free.

7. An encoding apparatus as defined in claim 6 further comprising means for breaking an input sequence of bits of data into equal sized vectors so as to produce said first input array of equal length vectors of size m.

8. An encoding apparatus as defined in claim 6 wherein the means for driving the accumulated sum of first moments of the individual vectors in the direction of zero further comprises calculating means for determining the first moments $m_1(\vec{x}_i)$ of the individual balanced vectors $\vec{x}_i$.

9. An encoding apparatus as defined in claim 6 wherein the means for driving the accumulated sum of first moments of the individual vectors in the direction of zero further comprises summing means for accumulating a running sum $m_1(m_{y-1})$ of all the first moments of all the balanced vectors.

10. An encoding apparatus as defined in claim 8 further comprising testing means for determining whether the addition of the first moment value $m_1(\vec{x}_i)$ to the accumulated sum of first moments $m_1(\vec{y}_{i-1})$ drives the new total accumulated first moment value in the direction of zero.

11. An encoding apparatus as defined in claim 10 further comprising means for adding together the calculated first moment value to the accumulated sum of first moments so as to produce a new accumulated sum of first moments.

12. An encoding apparatus as defined in claim 10 further comprising means for inverting the first moment value $m_1(\vec{x}_i)$ before the addition of this value to the accumulated sum of first moments.

13. An encoding apparatus as defined in claim 6 wherein the means for driving the accumulated sum of first moments of the individual vectors to zero further comprises:
means for inverting the bits of the input vector $\vec{x}_i$, and
means for toggling said sign-bit in the case wherein the bits of the input vector $\vec{x}_i$ have been inverted by the means for inverting.

14. An encoding apparatus as defined in claim 6 further comprising means for producing a last balanced vector having a first moment which, when added to the accumulated sum of first moments of all the vectors in the final output array, effectively drives the accumulated sum of first moments to zero.

15. An encoding apparatus as defined in claim 14 further comprising means for determining the absolute value t of the accumulated sum of first moments such that $t = m_1(\vec{y}_n)$ and means for determining the sign s of said total first moment value such that $s = \mathrm{SIGN}(m_1(\vec{y}_n))$, where n is the length of said vector.

16. An encoding apparatus as defined in claim 15 further comprising means for locating and marking the positions within said last vector such that at each position j the following function evaluates to 1 or 0, $$(j \leq Q) \oplus \left( j \geq \left( \frac{N}{2} + Q + 2 \right) \right) \oplus \left( j = \frac{N}{2} + Q + 1 - P \right)$$

where $\oplus$ denotes the boolean OR operation and $$N = m + 1 + r, \ Q = \mathrm{FLOOR}\left( \left| \frac{t}{n} \right| \right),$$

and $$P = \frac{1}{2} (t - QN).$$

17. An encoding apparatus as defined in claim 16 further comprising means for substituting said marked bit locations in said last vector with members of said bipolar binary alphabet such that 1→s and 0→s.

18. An encoding apparatus as defined in claim 6 wherein said means for producing a last vector further comprises means for appending the last vector to said final output array.

19. An encoding apparatus for constructing second order DC-free channel codes from an input data sequence over a bipolar binary alphabet, and comprising:
a) means for breaking said input sequence of bits of data into equal sized vectors so as to produce a first input array of equal length vectors of size m and means for appending to each input vector of length m of a first input array a sign-bit so as to produce a first output array of equal length vectors of size m+1;
b) means for balancing each vector in said first output array of vectors of size m+1 so as to produce a second output array of balanced vectors each of size m+1+r where r represents the number of redundancy bits appended to each vector of said first output array; and
c) means for driving an accumulated sum of first moments of the individual balanced vectors $\vec{x}_i$ of the second output array in the direction of zero so as to produce a final output array which is second order DC-free comprising:
calculating means for determining the first moments $m_1(\vec{x}_i)$ of the individual balanced vectors $\vec{x}_i$;
summing means for accumulating a running sum $m_1(m_{y-1})$ of all the first moments of all the balanced vectors;
testing means for determining whether the addition of the first moment value $m_1(\vec{x}_i)$ to the accumulated sum of first moments $m_1(\vec{y}_{i-1})$ drives the new total accumulated first moment value in the direction of zero;
means for inverting the first moment value $m_1(\vec{x}_i)$ before the addition of this value to the accumulated sum of first moments;
means for adding together the calculated first moment value to the accumulated sum of first moments so as to produce a new accumulated sum of first moments; and
means for inverting the bits of the input vector $\vec{x}_i$ and means for toggling said sign-bit in the case wherein the bits of the input vector $\vec{x}_i$ have been inverted; and
d) means for producing a last balanced vector having a first moment which, when added to the accumulated sum of first moments of all the vectors in the final output array, effectively drives the accumulated sum of first moments to zero.

20. An encoding apparatus as defined in claim 19 wherein said means for producing a last balancing vector further comprises means for determining the absolute value t of the accumulated sum of first moments such that $t=m_1(\vec{y}_n)$ and means for determining the sign s of said total first moment value such that $s=\text{SIGN}(m_1(\vec{y}_n))$, where n is the length of said vector.

21. An encoding apparatus as defined in claim 20 wherein said means for producing a last balancing vector further comprises means for locating and marking the positions within said last vector such that at each position j the following function evaluates to 7 or 0, $$(j \leq Q) \oplus \left(j \geq \left(\frac{N}{2} + Q + 2\right)\right) \oplus \left(j = \frac{N}{2} + Q + 7 - P\right)$$

where $\oplus$ denotes the boolean OR operation and $$N = m + 1 + r, \ Q = \text{FLOOR}\left(\left|\frac{t}{n}\right|\right),$$

and $$P = \frac{1}{2}(t - QN).$$

22. An encoding apparatus as defined in claim 21 wherein said means for producing a last balancing vector further comprises means for substituting said marked bit locations in said last vector with members of said bipolar binary alphabet such that $1 \rightarrow s$ and $0 \rightarrow -s$.

23. An encoding apparatus as defined in claim 19 wherein said means for producing a last vector further comprises means for appending said last vector to said final output array.

24. A method for encoding a second order DC-free array comprising the steps of:
 a) balancing each vector in a first array of vectors to be second order DC-constrained; and
 b) constructing a second order DC-constrained final output array by determining whether the addition of a vector's first moment value to an accumulated sum of first moments drives the accumulated sum of first moments in a direction toward zero or away from zero.

25. A method for encoding as defined in claim 24 further comprising the steps of:
 a) appending a sign-bit to each vector of said first array; and
 b) toggling said sign-bit to indicate bit inversion if said determined direction of the addition of a vector's first moment value to said accumulated sum of first moments is away from zero.

26. A method for encoding as defined in claim 24 further comprising the step of appending a last balanced vector to said final output array wherein said last vector is derived from said accumulated sum of first moments.

27. A method for encoding as defined in claim 24 wherein said step of constructing said final output array further comprises the steps of:
 a) determining a first moment value of a balanced vector; and
 b) accumulating an accumulated sum of first moments by performing the addition of said determined first moment value to said accumulated sum of first moments.

28. A method for encoding as defined in claim 24 further comprising the steps of:
 a) inverting said first moment value prior to addition, if the addition thereof to said accumulated sum of first moments effectively drives the accumulated sum of first moments in a direction away from zero; and
 b) complementing the bits of said balanced vector in the case where the fist moment value has been inverted prior to addition thereof to the accumulated sum of first moments.

29. A method for encoding as defined in claim 24 wherein said step of constructing the second order DC-free output array further comprises the step of producing a last balanced vector to be added to said output array of vectors.

30. A method for encoding a second order DC-free array from an input data sequence over a bipolar binary alphabet comprising the steps of:
 a) appending to each input vector of length m of a first input array a sign-bit so as to produce a first output array of equal length vectors of size m+1;
 b) balancing each vector in the first output array of vectors of size m+1 so as to produce a second output array of balanced vectors each of size m+1+r where r represents the number of redundancy bits appended to each vector of the first output array; and
 c) driving an accumulated sum of first moments of the balanced vectors $\bar{x}_i$ of the second output array in the direction of zero so as to produce a final output array which is second order DC-free.

31. A method for encoding as defined in claim 30 further comprising the step of breaking an input sequence of bits of data into equal sized vectors so as to produce said first input array of equal length vectors of size m.

32. A method for encoding as defined in claim 30 further comprising the steps of determining the first moments $m_1(\bar{x}_i)$ of the individual balanced vectors $\bar{x}_i$ and accumulating an accumulated sum $m_1(m_{y-1})$ of the first moments of all the balanced vectors.

33. A method for encoding as defined in claim 30 further comprising the step of determining whether the addition of the first moment value $m_1(\bar{x}_i)$ to the accumulated sum of first moments $m_1(\bar{y}_{i-1})$ drives the accumulated sum of first moments in the direction of zero.

34. A method for encoding as defined in claim 30 further comprising the step of inverting the first moment value $m_1(\bar{x}_i)$ before the addition of this value to the accumulated sum of first moments.

35. A method for encoding as defined in claim 30 further comprising the step of adding together the calculated first moment value to the accumulated sum of first moments so as to produce a new accumulated sum of first moments.

36. A method for encoding as defined in claim 30 further comprising the steps of inverting the bits of said input vector $\bar{x}_i$ and toggling said sign-bit in the case wherein the bits of the input vector $\bar{x}_i$ have been inverted.

37. A method for encoding as defined in claim 30 further comprising the step of producing a last balanced vector having a first moment which, when added to the accumulated sum of first moments of all the vectors in the final output array, effectively drives the accumulated sum of first moments to zero.

38. A method for encoding as defined in claim 37 further comprising the steps of determining the absolute value t of the accumulated sum of first moments such that $t=m_1(\vec{y}_n)$ and determining the sign s of said accumulated sum of first moments such that $s=\text{SIGN}(m_1(\vec{y}_n))$, where n is the length of said vector.

39. A method for encoding as defined in claim 38 further comprising the step of locating and marking the positions within said last vector such that at each position j the following function evaluates to 1 or 0, $$(j \leq Q) \oplus \left( j \geq \left( \frac{N}{2} + Q + 2 \right) \right) \oplus \left( j = \frac{N}{2} + Q + 1 - P \right)$$

where $\oplus$ denotes the boolean OR operation and $$N = m + 1 + r, \; Q = \text{FLOOR}\left( \left| \frac{t}{n} \right| \right),$$

and $$R = \frac{1}{2}(t - QN).$$

40. A method for encoding as defined in claim 39 further comprising the step of substituting said marked bit locations in said last vector with members of said bipolar binary alphabet such that $1 \to s$ and $0 \to -s$.

41. A method for encoding as defined in claim 30 further comprising the step of appending the last vector to the final output array.

42. A decoding apparatus for converting a balanced second order DC-free array to an output data sequence over a bipolar binary alphabet, comprising:
   a) means for removing a last vector from the data array;
   b) means for reversing the balancing of said data array;
   c) means for detecting and inverting those vectors in said data array which have been inverted; and
   c) means for removing a sign bit appended to each vector of said data array.

43. A digital communication system having an encoder and decoder wherein said encoder converts an input data sequence of a bipolar binary alphabet into a high-rate second order DC-free channel code for transmission and storage, and wherein said decoder converts said high-rate second order DC-free channel code back into said input data sequence upon reception and retrieval thereof, said system comprising:
   a) means for encoding an input data sequence into a high-rate second order DC-free code, said means for encoding including:
      means for dividing the input data sequence into input vectors;
      means for balancing the input vectors to produce balanced vectors $\vec{x}_i$;
      means for computing a first moment for each of the balanced vectors $\vec{x}_i$;
      means for accumulating an accumulated sum of the first moments;
      and means for driving the accumulated sum of the first moments of the balanced vectors $\vec{x}_i$ in the direction of zero so as to produce a final output array which is second order DC-free;
   b) means for transmitting said second order DC-free channel code;
   c) means for receiving said second order DC-free channel code; and
   d) means for decoding said received second order DC-free channel code to reproduce said input data sequence, the means for decoding including means for removing a last vector from the received sound order DC-free channel code;
      means for detecting and inverting those vectors in said received second order DC-free channel code which have been inverted; means for removing a sign bit appended to each vector; and means for reversing a balancing of each vector.

44. A digital communication systems as defined in claim 43 wherein said means for dividing includes means for breaking said input sequence of data into equal sized vectors so as to produce an input array of equal length vectors.

45. A digital communication systems as defined in claim 43 further comprising means for appending a sign bit to each input vector produced by the means for dividing.

46. A digital communication systems as defined in claim 43 wherein said encoding means further comprises means for appending a last vector to said final output array.

47. A digital data storage and retrieval system having an encoder and decoder wherein said encoder converts an input data sequence of a bipolar binary alphabet into a high-rate second order DC-free channel code for transmission and storage, and wherein said decoder converts said high-rate second order DC-free channel code back into said input data sequence upon reception and retrieval thereof, said digital data storage and retrieval system comprising:
   a) digital data storage medium for storage of an encoded data array;
   b) means for encoding an input data sequence into a high-rate second order DC-free code, said means for encoding including
      means for dividing the input data sequence into input vectors;
      means for balancing the input vectors to produce balanced vectors $\vec{x}_i$;
      means for computing a first moment for each of the balanced vectors $\vec{x}_i$;
      means for accumulating an accumulated sum of the first moments;
      and means for driving the accumulated sum of the first moments of the balanced vectors $\vec{x}_i$ in the direction of zero so as to produce a final output array which is second order DC-free;
   c) means for recording said second order DC-free channel code on said storage medium;
   d) means for retrieving said second order DC-free channel code from said storage medium; and
   d) means for decoding said second order DC-free channel code retreived by the means for retreiving to reproduce said input data sequence, said means for decoding including means for removing a last vector from the data array;
      means for detecting and inverting those vectors in said received data array which have been complemented;

means for removing a sign bit appended to each vector; and means for reversing a balancing of each vector.

48. A digital data storage and retrieval system as defined in claim 47 wherein said encoding means further comprises means for breaking said input sequence of data into equal sized vectors so as to produce an input array of equal length vectors.

49. A digital data storage and retrieval system as defined in claim 47 further comprising means for appending to each input vector a sign-bit.

50. A digital data storage and retrieval system as defined in claim 47 further comprising means for balancing each vector so as to produce an output array of balanced vectors.

51. A digital data storage and retrieval system as defined in claim 47 wherein said encoding means further comprises means for appending a last vector to said final output array.

* * * * *

UNITED STATES PATENT AND TRADEMARK OFFICE
CERTIFICATE OF CORRECTION

PATENT NO. : 5,450,443
DATED : Sep. 12, 1995
INVENTOR(S) : P. H. Siegel; A. Vardy It is certified that error appears in the above-identified patent and that said Letters Patent is hereby corrected as shown below:

column 11, line 6, change "$t = m_1(\vec{y_n})$" to --$t = |m_1(\vec{y_n})|$-- column 22, line 11, change "fist" to --first--

Signed and Sealed this

Fifth Day of March, 1996

Attest:

BRUCE LEHMAN

Attesting Officer

Commissioner of Patents and Trademarks